United States Patent
Utturkar et al.

(10) Patent No.: US 8,188,742 B2
(45) Date of Patent: May 29, 2012

(54) SYSTEM AND METHOD FOR THERMO-ELECTRIC COOLING OF RF COILS IN AN MR IMAGING SYSTEM

(75) Inventors: Yogen Vishwas Utturkar, Niskayuna, NY (US); Jennifer L. Jackson, Troy, NY (US); Charles Franklin Wolfe, Albany, NY (US); Bruce C. Amm, Clifton Park, NY (US)

(73) Assignee: General Electric Company, Niskayuna, NY (US)

( * ) Notice: Subject to any disclaimer, the term of this patent is extended or adjusted under 35 U.S.C. 154(b) by 383 days.

(21) Appl. No.: 12/533,342

(22) Filed: Jul. 31, 2009

(65) Prior Publication Data

US 2011/0025329 A1 Feb. 3, 2011

(51) Int. Cl.
*G01V 3/00* (2006.01)
(52) U.S. Cl. ....................................... 324/318
(58) Field of Classification Search ........... 324/300–322
See application file for complete search history.

(56) References Cited

U.S. PATENT DOCUMENTS

| | | | |
|---|---|---|---|
| 6,038,867 A | 3/2000 | Einziger et al. | |
| 6,489,873 B1 | 12/2002 | Kruip et al. | |
| 6,573,596 B2 | 6/2003 | Saika | |
| 6,812,705 B1 | 11/2004 | Sellers | |
| 7,141,979 B2 * | 11/2006 | Marek | 324/322 |
| 7,167,000 B2 | 1/2007 | Amm et al. | |
| 7,812,606 B2 * | 10/2010 | Burns | 324/318 |
| 2002/0073717 A1 | 6/2002 | Dean et al. | |
| 2005/0179512 A1 | 8/2005 | Weyers et al. | |
| 2009/0033450 A1 | 2/2009 | Huang et al. | |
| 2009/0039991 A1 | 2/2009 | Atkins et al. | |

FOREIGN PATENT DOCUMENTS

EP 1744170 A1 1/2007

OTHER PUBLICATIONS

Spanoudaki V.C et al.; "Effect of Temperature on the Performance of Proportional APD-Based Modules for Gamma Ray Detection in Positron Emission Tomography"; Nuclear Science, IEEE Transactions on Nuclear Science, vol. 55, Issue 1, Feb. 2008, pp. 469-480.

* cited by examiner

*Primary Examiner* — Dixomara Vargas
(74) *Attorney, Agent, or Firm* — Scott J. Asmus

(57) ABSTRACT

A cooling system for reducing the thermal energy transfer from the heated spots of an RF coil assembly to a patient bore of an MRI system is disclosed. The MRI system includes a plurality of gradient coils positioned about a bore of a magnet, an RF shield formed about an RF space, and an RF coil assembly positioned within the RF space and about the patient bore. The cooling system is positioned within the RF space and includes a plurality of cooling modules configured to reduce an operating temperature of the MRI system. Each of the plurality of cooling modules further includes a thermo-electric cooler thermally coupled to the RF coil and a heat sink thermally coupled to the thermoelectric cooler opposite from the RF coil. The thermoelectric cooler is configured to extract heat from the RF coil when a current is applied to the thermoelectric cooler.

25 Claims, 6 Drawing Sheets

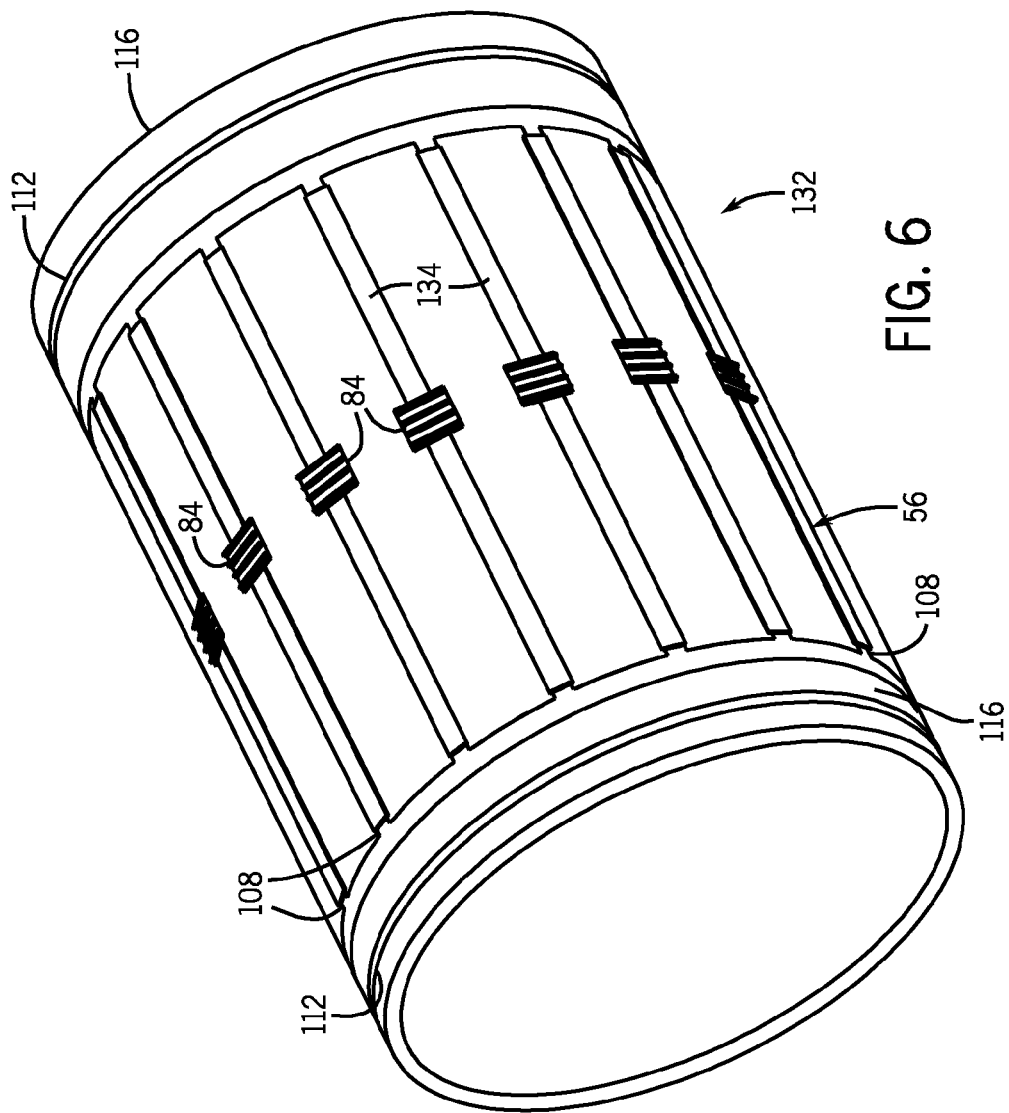

SYSTEM AND METHOD FOR THERMO-ELECTRIC COOLING OF RF COILS IN AN MR IMAGING SYSTEM

BACKGROUND OF THE INVENTION

The invention relates generally to systems and techniques for cooling magnetic resonance imaging systems and, more particularly, to a system for reducing the thermal energy transfer from the heated spots of an RF coil assembly to a patient bore.

Currently, Magnetic Resonance Imaging (MRI) systems have included a superconducting magnet that generates a temporally constant primary magnetic field. The superconducting magnet is used in conjunction with a magnetic gradient coil assembly, which is sequentially pulsed, to create a sequence of controlled gradients in the static magnetic field during an MRI data gathering sequence. The controlled gradients are effectuated throughout a patient imaging volume (patient bore), which is coupled to one or more radio frequency (RF) coils or antennae. The RF coils are located between the magnetic gradient coil assembly and the patient bore.

As a part of a typical MRI sequence, RF signals of suitable frequencies are transmitted into the patient bore. Nuclear magnetic resonance (nMR) responsive RF signals are received from the patient bore via the RF coils. Information encoded within the frequency and phase parameters of the received RF signals, by the use of an RF circuit, is processed to form visual images. These visual images correspond to the distribution of nMR nuclei within a cross-section or volume of the patient within the patient bore.

As is well known in the MRI industry, high power MRI systems consume large amounts of electrical power. In particular, the gradient and RF coils consume excessive amounts of power and, as a result, these coils generate significant heat. While a majority of the heat dissipation on the gradient coils is resistive in nature, the heat dissipation on the RF coil could be inductive due to the eddy currents induced by the time-varying gradient coil magnetic field. As a specific example, the high frequency switching during the running of gradient coil waveforms is known to cause eddy current formation at the end zones of the RF coils, thereby generating localized heat. As one would expect, excessive heat can cause system components to deteriorate or fail prematurely and hence adversely affects reliability. In addition, heat can be an annoyance to a patient during the imaging process. For this reason there are regulations that stipulate the maximum temperature of a patient support table, which effectively limits the amount of power that can be used in any MRI system. One way to minimize heat is to reduce coil currents but that solution reduces performance and can also adversely affect overall system efficiency.

Some MRI systems have been designed such that cooling air (i.e., chilled air) is passed through designated cooling air spaces between the RF coil and the gradient coils, thus dissipating coil heat. Unfortunately, designs of this type increase overall system volume, size, and costs. In addition, while air clearly reduces coil temperatures, in some cases the degree of cooling is insufficient to drive the coils at maximum coil currents and thus performance in these systems is minimized. That is, because of the limited heat flux entitlement associated with air cooling, air cooling is not completely adequate for cooling the RF coils and preventing the generated heat from transferring to the patient bore unless the air is chilled to a large degree. As a result, higher currents, cooling efficiency, and scanning times must be sacrificed in chilled air cooling systems in order to maintain the patient bore temperature within an acceptable, specified range thereby limiting performance of the MRI system.

One other solution has been to provide a hermetically sealed liquid cooling system with cooling conduits adjacent the gradient coils. According to systems having such a design, liquid coolant (e.g., water) is pumped through the system to cool the coils during field generation and data acquisition. Unfortunately, while liquid cooling systems have worked well for the purpose of cooling gradient coils, such systems have not been applied to cooling system components that reside inside the RF space such as the RF coils, the patient support table, etc. The primary reason for not providing a liquid cooled configuration that extends into the RF space is that coolant hydrogen atoms, like human tissue, include a large number of protons that, when inside the RF shield, tend to generate nMR signals. These spurious signals, like the signals generated by the excited human tissue, are received by the detector coils and distort the resulting data and associated images. Thus, liquid cooling systems have been limited to areas outside the RF shield to avoid spurious signal excitation and air cooling systems have been employed for cooling the RF coils.

It would therefore be desirable to have a system and method that minimizes thermal energy transfer from the RF coil assembly to the patient bore without degradation of nMR signals.

BRIEF DESCRIPTION OF THE INVENTION

The invention provides a system for reducing the thermal energy transfer from the heated spots of an RF coil assembly to a patient bore.

In accordance with one aspect of the invention, a MRI apparatus includes a MRI system having a plurality of gradient coils positioned about a bore of a magnet, an RF shield formed about an RF space, and an RF transceiver system and an RF switch controlled by a pulse module to transmit RF signals to an RF coil assembly positioned within the RF space and about a patient bore so as to acquire MR images. The MRI apparatus also includes a cooling system positioned within the RF space and having a plurality of cooling modules configured to reduce an operating temperature of the MRI system. Each of the plurality of cooling modules further includes a thermoelectric cooler thermally coupled to the RF coil and a heat sink thermally coupled to the thermoelectric cooler and mounted on a side of the thermoelectric cooler facing away from the RF coil, wherein the thermoelectric cooler is configured to extract heat from the RF coil when a current is applied to the thermoelectric cooler.

In accordance with another aspect of the invention, a method for manufacturing a cooling system for reducing operating temperature of an MRI system is provided, with the MRI system including an RF coil, a set of gradient coils, and an RF shield, the RF shield formed about an RF space, the RF coil being positioned within the RF space and formed about an imaging area, and the gradient coils being formed about the RF shield such that the shield de-couples the RF coil from the gradient coils. The method includes the steps of providing a plurality of cooling modules, each of the plurality of cooling modules comprising a thermoelectric cooler and a heat sink affixed to the thermoelectric cooler and mounting each of the plurality of cooling modules to the RF coil such that the thermoelectric cooler is coupled to the RF coil. The method also includes the step of electrically connecting a power source to the plurality of cooling modules to provide power thereto.

In accordance with yet another aspect of the invention, a cooling system for reducing MRI system operating temperature is provided, with the MRI system including an RF coil, a set of gradient coils and an RF shield, the RF shield being formed about an RF space, the RF coil being positioned within the RF space and formed about an imaging area, and the gradient coils being formed about the RF shield such that the RF shield de-couples the RF coil from the gradient coils. The cooling system includes a plurality of cooling modules positioned within the RF space that are configured to extract heat from the RF coil. Each of the plurality of cooling modules further includes a thermoelectric cooler positioned adjacently to a rung of the RF coil and a heat spreader mounted on a side of the thermoelectric cooler opposite from the RF coil, the thermoelectric cooler being configured to extract heat from the RF coil when a current is applied to the thermoelectric cooler and transfer the heat to the heat spreader.

Various other features and advantages will be made apparent from the following detailed description and the drawings.

BRIEF DESCRIPTION OF THE DRAWINGS

The drawings illustrate preferred embodiments presently contemplated for carrying out the invention.

In the drawings:

FIG. 6 is a perspective view of an RF coil and associated cooling system according to an embodiment of the invention.

DETAILED DESCRIPTION OF THE PREFERRED EMBODIMENT

A system is shown for reducing the thermal energy transfer from the RF coil assembly of an MRI system to a patient bore. The system includes a plurality of cooling modules that are formed in part from a thermoelectric cooler. Each of the cooling modules further includes therein a heat sink/spreader that is mounted on the thermoelectric cooler. The cooling modules are thermally and mechanically coupled to the RF coil of the MRI system such that the thermoelectric cooler is in contact with the hotspots on the RF coil. Heat is extracted from the RF coil by the thermoelectric cooler and transferred to the heat sink, such that even air at room temperature (i.e., non-chilled) can be blown across the heat sink to dissipate the heat from the RF coil. Eliminating the air chiller reduces the inventory carry value of the MR system besides simplifying the cooling cabinet.

Figure 1:
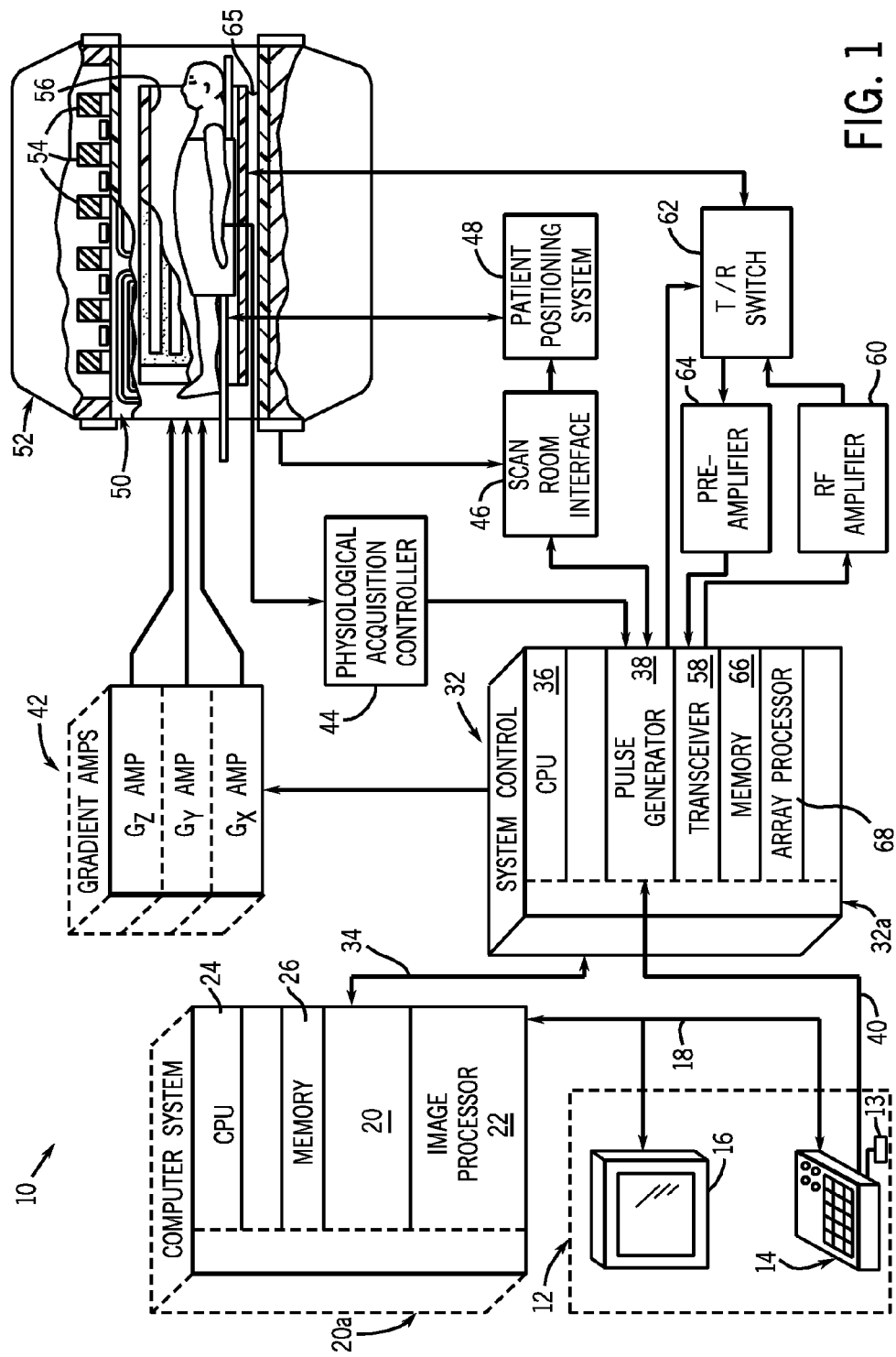
FIG. 1 is a schematic block diagram of an MR imaging system incorporating the invention.

Referring to FIG. 1, the major components of a preferred magnetic resonance imaging (MRI) system 10 incorporating an embodiment of the invention are shown. The operation of the system is controlled from an operator console 12, which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired location for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52, which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or the receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

Figure 2:
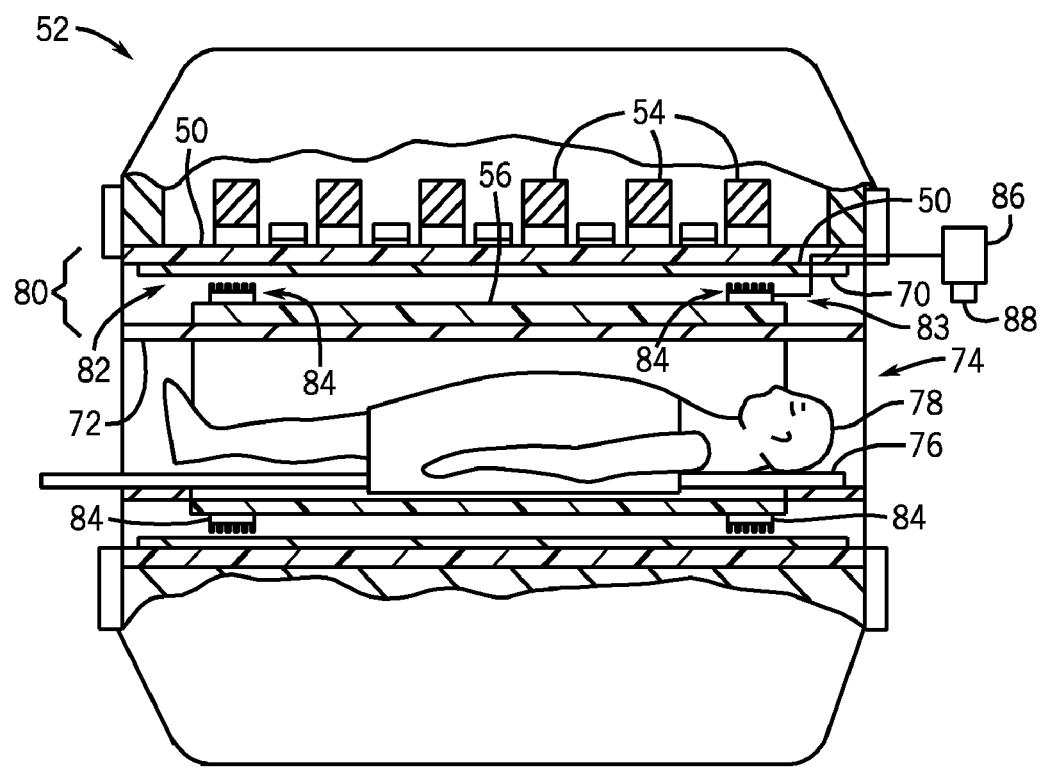
FIG. 2 is a schematic block diagram of an MR magnet assembly and associated cooling system according to an embodiment of the invention.

Referring now to FIG. 2, a cross-sectional view of magnet assembly 52 is shown according to an embodiment of the invention. Magnet assembly 52 includes gradient coil assembly 50, polarizing magnet 54, and RF coil 56. Also included in magnet assembly 52 are an RF shield 70 and a patient enclosure wall 72. Wall 72 forms an annular receiving or imaging area 74 (i.e., patient bore) for receiving a table 76 and a patient 78 supported thereon. RF coil 56 is formed about wall 72 and is surrounded by RF shield 70. Shield 70 is in turn surrounded by the polarizing magnet 54 and gradient coil assemblies 50. Shield 70 is provided to de-couple the RF coils 56 and the gradient coils 50 and various constructions of the shield are well known in the MRI art. Thus, shield 70 forms an "RF space" 80 in which the RF coil 56 and the enclosure wall 72 reside.

As shown in FIG. 2, RF space 80 includes a thin radial space/channel 82 adjacent the RF coil 56 through which chilled air can be blown to remove heat from the RF coil, such as heat generated by eddy currents. In order to improve efficiency in cooling the RF coils, a cooling system 83 including a plurality of cooling modules 84 is positioned adjacent the RF coil 56 and in channel 82. The plurality of cooling modules 84 are positioned in the channel 82 and mechanically and thermally coupled to the RF coil. The cooling modules 84 are in the form of thermoelectric coolers (TECs) or Peltier coolers that transfer or draw heat away from RF coils 56 and toward channel 82. That is, cooling modules 84 use the Peltier effect to create a heat flux between the junction of RF coils 56 and the material forming the cooling module, thereby transferring heat from one side of the cooling module 84 to the other side against the temperature gradient (from cold to hot), with consumption of electrical energy.

In operation of cooling system 83, power is provided to cooling modules 84 in a controlled manner by a power source 86 and a controller 88 operatively connected to the power source, thereby causing the cooling modules 84 to extract a desired amount of heat from RF coils 56. Upon the supplying of a controlled power (i.e., current ranging from 0.5 to 1.0 Amps, for examples) to cooling modules 84 from power source 86, one side of cooling module 84 is caused to cool while the other side warms. The rate at which heat is moved away from the cold side of cooling module 84 is controlled based on the amount of current provided to the cooling module 84 and how well the heat from the hot side can be removed (e.g., based on a Peltier coefficient of a thermocouple in the cooling module, which represents how much heat current is carried per unit charge through a given material). According to an exemplary embodiment, controller 88 is programmed to operate power source 86 to control the amount of current provided to cooling modules so as to achieve a desired air temperature within patient bore. That is, controller functions to operate power source 86 to increase/decrease the amount of current provided to cooling modules so as to extract a greater or lesser amount of thermal energy (i.e., heat) from RF coil, thereby lowering/raising the air temperature within patient bore to the desired level.

Figure 3:
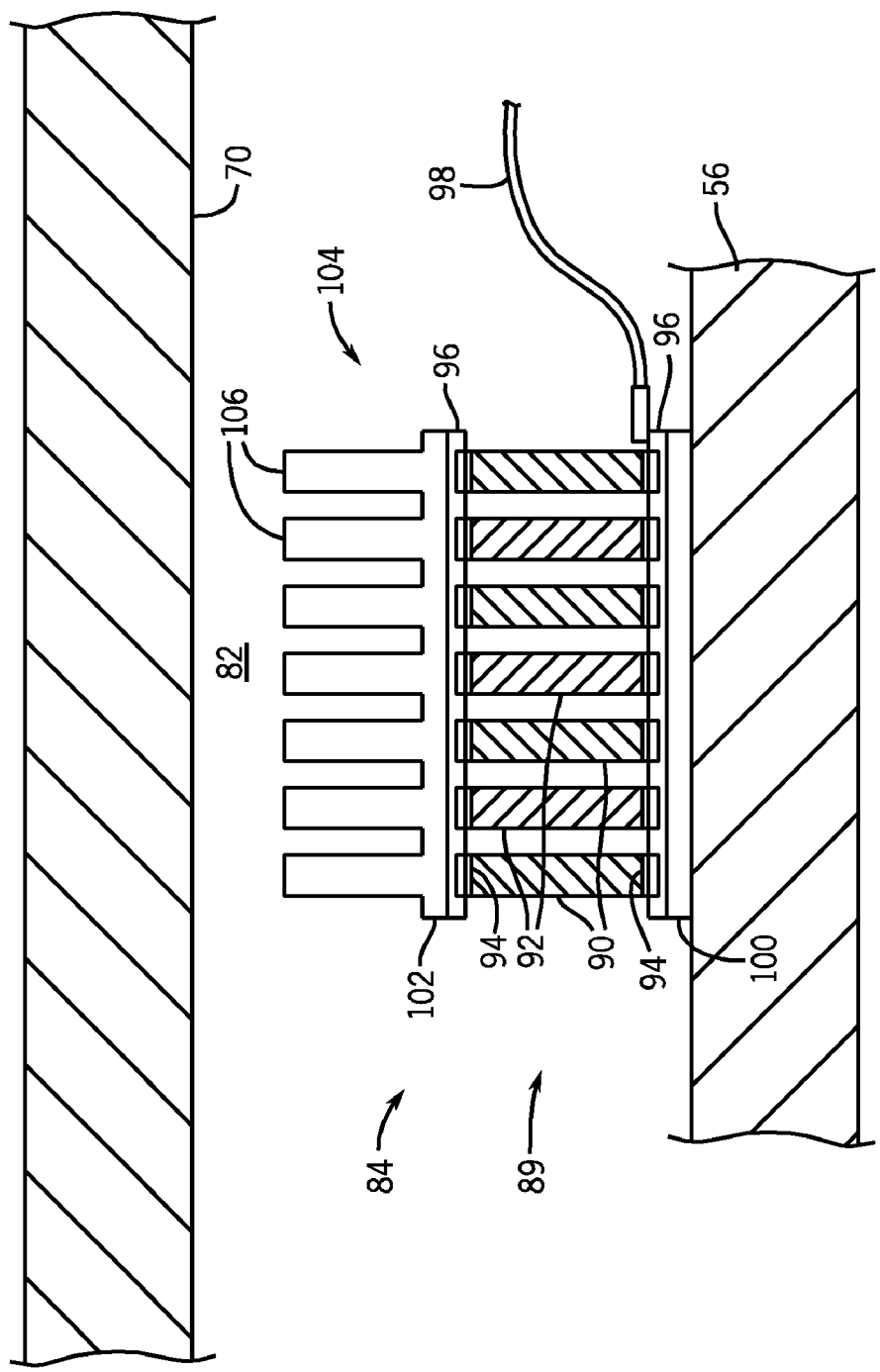
FIG. 3 is a cross-sectional view of a cooling module included in the cooling system of FIG. 2 according to an embodiment of the invention.

Referring now to FIG. 3, a detailed view of a cooling module 84 is shown according to an embodiment of the invention. Each cooling module 84 includes a thermoelectric cooler 89 having an array of thermoelectric legs 90 and 92 of n-type and p-type semiconductor material (i.e., a thermocouple). The legs 90 of n-type material and the legs 92 of p-type material are arranged in rows and columns of alternatively placed n-type and p-type legs. According to an exemplary embodiment, thermoelectric legs 90 and 92 of n-type and p-type semiconductor material are formed of bismuth telluride ($Bi_2Te_3$).

First and second opposing ends of the legs 90 and 92 have deposited thereon a coating 94 of non-magnetic, electrically conductive material that forms a diffusion barrier and provide a solderable surface. A suitable non-magnetic material for coatings 94 is, for example, molybdenum. The coatings 94 are then connected to conductive tab metallizations 96, which receive current from power source by way of leads/conductors 98. It is recognized, however, that cooling module 84 could be formed without coatings 94 on the thermoelectric legs 90 and 92, according to alternative embodiments of the invention.

Also included in thermoelectric cooler 89 are electrically insulating substrate layers 100 and 102. As shown in FIG. 3, the thermoelectric legs 90 and 92 are sandwiched between electrically insulating substrate layers 100 and 102. The substrates 100 and 102 are made of a suitable substrate material such as, for example, a ceramic, alumina, beryllia, or a suitable polyimide material, such as Kapton®. The bottom substrate layer 100 in thermoelectric cooler 89 is bonded to RF coil 56 and the top substrate layer 102 is bonded to a heat sink 104 that is included in cooling module 84. According to an exemplary embodiment, the heat sink 104 of cooling module is constructed of a ceramic material having a high rate of heat transfer, such as Alumina or Aluminum nitride, although the heat sink could also be constructed of aluminum or stainless steel, for example. The heat sink 104 is bonded to thermoelectric cooler 89, such as by way of solder pads (not shown) or as a part of an integrated ceramic substrate layer 102, and includes thereon a plurality of fins 106 that extend out into radial channel 82. The fins 106 provide a large surface area for chilled air to blow across in radial channel 82, thereby improving heat dissipation of cooling module 84 and drawing an increased amount of heat from RF coils 56.

Figure 4:
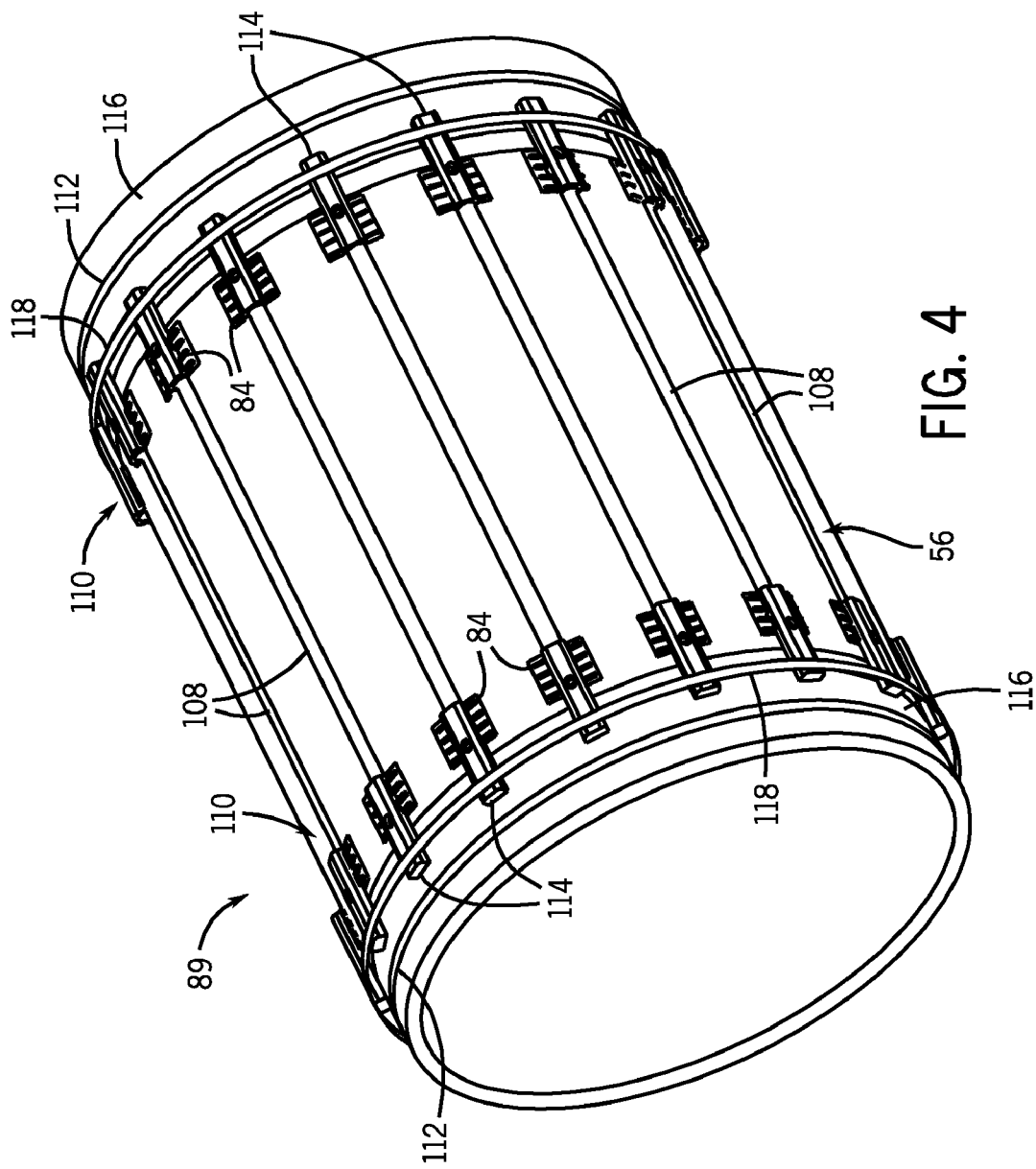
FIG. 4 is a perspective view of an RF coil and associated cooling system according to an embodiment of the invention.

Referring now to FIG. 4, an arrangement of cooling modules 84 mounted to RF coil 56 is shown where a pair of cooling modules is mounted to each rung 108 of the RF coil, according to an embodiment of the invention. Cooling modules 84 are mounted to rungs 108 at each of a pair of "hot spots" 110 on the rung, which as shown in FIG. 4, are located on the rungs 108 adjacent end rings 112 of the RF coil 56 and may be in the form of dissipative copper pieces. The cooling modules 84 are mounted to rungs 108 by way of non-magnetic mounting pieces (e.g. screws, not shown) or brackets 114 (e.g., stainless steel brackets), which compression mount the cooling modules 84 to the rungs 108. Mounting brackets 114 are secured to an RF former 116, such as by way of a circular compression band 118 that extends around (i.e., encircles) RF former 116 as shown in FIG. 4, and extend over cooling modules 84 to exert a compressive force thereon to secure the cooling modules 84 to the rungs 108. Alternatively, it is recognized that mounting brackets 114 could be secured to RF former 116 by way of screws or other similar hardware.

Figure 5:
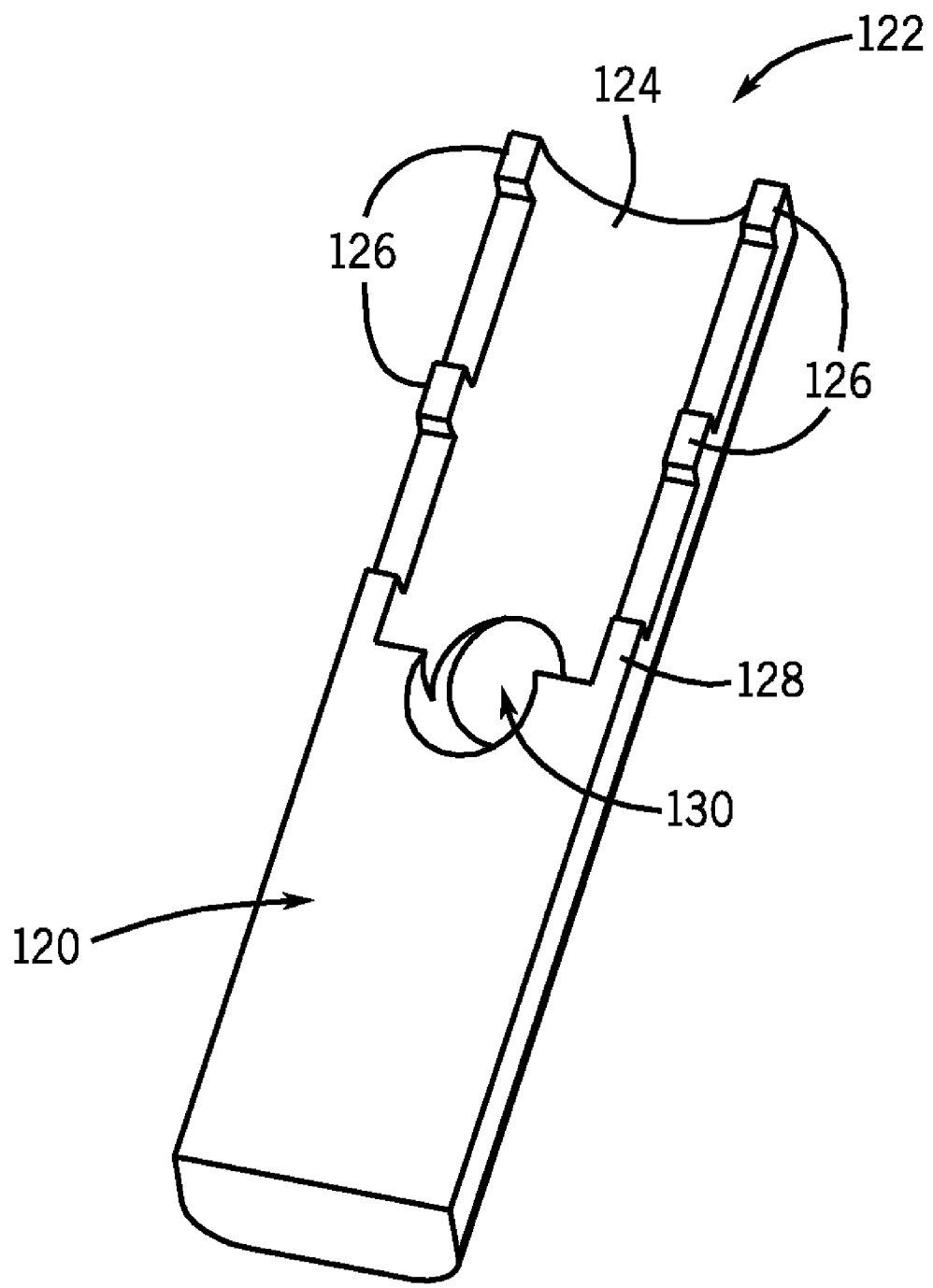
FIG. 5 is a detailed view of a mounting back for securing the cooling system of FIG. 3 to the RF coil according to an embodiment of the invention.

A more detailed view of mounting bracket 114 is shown in FIG. 5. Mounting bracket 114 includes a fixation portion 120 that is positioned over RF former 116 and secured thereto, such as by way of a compression band 118 or screws, as shown in FIG. 4. According to an exemplary embodiment, fixation portion 120 is compression mounted to RF former 116 by tightening compression band 118 around the RF former. Referring again to FIG. 5, a compression portion 122 of mounting bracket 114 extends out from fixation portion 120 and is configured to apply a compressive force onto cooling 84 module to secure the module to a rung 108 of the RF coil 56. According to an exemplary embodiment, compression portion 122 includes a central area 124 having a cylindrical shape that is designed to be placed over the heat sink 104 (FIG. 3) of the cooling module 84. The cylindrical shape of central area 124 allows for a separation to be maintained between mounting bracket 114 and fins 106 of heat sink 104 (FIG. 3), such that contact therebetween is prevented. Also formed on compression portion 122 of mounting bracket 114 are legs 126 that extend out from outer edges or a perimeter 128 (i.e., an outer area) of the compression portion 122. According to an exemplary embodiment, four legs 126 are arranged in a "spider leg" arrangement that extend out from outer edges 128 of compression portion 122 to make contact with heat sink 104 (FIG. 3) when mounting bracket 114 is positioned above cooling module 84. The spider leg arrangement of legs 126 forms air channels between mounting bracket 114 and cooling module 84 along the outer edges 128 of compression portion 122. When compression band 118 (FIG. 4) is tightened on RF former 116, the compression portion 122 of mounting bracket 114 is forced toward cooling module 84, such that legs place a compressive force on the cooling module to compression mount the module to a rung 108 or RF former 56 (FIG. 4).

As further shown in FIG. 5, mounting bracket 114 includes a circular opening 130 formed in the central area 124 of compression portion 122. Opening 130 allows for a flow of chilled air to enter the area/gap between the central area 124 of compression portion 122 and the heat sink 104 (FIG. 3) of cooling module 84. Chilled air is thus not blocked or prevented from flowing across fins 106 of heat sink 104 (FIG. 3) and adversely affecting the cooling efficiency of cooling modules 84.

Referring now to FIG. 6, a cooling system 132 is shown according to another embodiment of the invention. The cooling system 132 includes therein a vapor chamber 134 corresponding to each of the plurality of rungs 108 of RF coil 56. Each vapor chamber 134 runs a length of the rung 108 and has a structure consistent with vapor chambers known in the art. Cooling system 132 also includes an arrangement of cooling modules 84 thermally coupled to RF coil 56 by way of vapor chambers 134. As shown in FIG. 6, a single cooling module 84 corresponds to each rung 108 of the RF coil 56. The cooling module 84 is mounted to vapor chamber 134 at a central location 136 of the rung 108, equidistant between end rings 112 of the RF coil 56. That is, the thermoelectric cooler 89 (FIG. 3) in cooling module is secured to vapor chamber 134, with heat sink 104 (FIG. 3) extending out therefrom into channel 82 through which chilled air is blown. In operation, vapor chambers 134 draw heat from RF coil 56 during operation thereof. The cooling modules 84 subsequently extract heat from vapor chambers 134 upon application of a controlled current thereto by power source 86 and controller 88, as set forth in detail above.

Therefore, according to one embodiment of the invention, a MRI apparatus includes a MRI system having a plurality of gradient coils positioned about a bore of a magnet, an RF shield formed about an RF space, and an RF transceiver system and an RF switch controlled by a pulse module to transmit RF signals to an RF coil assembly positioned within the RF space and about a patient bore so as to acquire MR images. The MRI apparatus also includes a cooling system positioned within the RF space and having a plurality of cooling modules configured to reduce an operating temperature of the MRI system. Each of the plurality of cooling modules further includes a thermoelectric cooler thermally coupled to the RF coil and a heat sink thermally coupled to the thermoelectric cooler and mounted on a side of the thermoelectric cooler facing away from the RF coil, wherein the thermoelectric cooler is configured to extract heat from the RF coil when a current is applied to the thermoelectric cooler.

According to another embodiment of the invention, a method for manufacturing a cooling system for reducing operating temperature of an MRI system is provided, with the MRI system including an RF coil, a set of gradient coils, and an RF shield, the RF shield formed about an RF space, the RF coil being positioned within the RF space and formed about an imaging area, and the gradient coils being formed about the RF shield such that the shield de-couples the RF coil from the gradient coils. The method includes the steps of providing a plurality of cooling modules, each of the plurality of cooling modules comprising a thermoelectric cooler and a heat sink affixed to the thermoelectric cooler and mounting each of the plurality of cooling modules to the RF coil such that the thermoelectric cooler is coupled to the RF coil. The method also includes the step of electrically connecting a power source to the plurality of cooling modules to provide power thereto.

According to yet another embodiment of the invention, a cooling system for reducing MRI system operating temperature is provided, with the MRI system including an RF coil, a set of gradient coils and an RF shield, the RF shield being formed about an RF space, the RF coil being positioned within the RF space and formed about an imaging area, and the gradient coils being formed about the RF shield such that the RF shield de-couples the RF coil from the gradient coils. The cooling system includes a plurality of cooling modules positioned within the RF space that are configured to extract heat from the RF coil. Each of the plurality of cooling modules further includes a thermoelectric cooler positioned adjacently to a rung of the RF coil and a heat spreader mounted on a side of the thermoelectric cooler opposite from the RF coil, the thermoelectric cooler being configured to extract heat from the RF coil when a current is applied to the thermoelectric cooler and transfer the heat to the heat spreader.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:
1. An MRI apparatus comprising:
  a magnetic resonance imaging (MRI) system having a plurality of gradient coils positioned about a bore of a magnet, an RF shield formed about an RF space, and an RF transceiver system and an RF switch controlled by a pulse module to transmit RF signals to an RF coil assembly positioned within the RF space and about a patient bore so as to acquire MR images; and
  a cooling system positioned within the RF space and including a plurality of cooling modules configured to reduce an operating temperature of the MRI system, wherein each of the plurality of cooling modules comprises:
    a thermoelectric cooler thermally coupled to the RF coil; and a heat sink thermally coupled to the thermoelectric cooler and mounted on a side of the thermoelectric cooler facing away from the RF coil;

wherein the thermoelectric cooler is configured to extract heat from the RF coil when a current is applied to the thermoelectric cooler.

2. The MRI apparatus of claim 1 wherein the plurality of cooling modules extend out from the RF coil and into a cooling channel formed between the RF shield and the RF coil.

3. The MRI apparatus of claim 2 wherein the heat extracted from the RF coil is rejected out from the cooling module through the heat sink and into air flowing through the cooling channel.

4. The MRI apparatus of claim 1 wherein the thermoelectric cooler comprises:
a pair of electrically insulating substrates;
a plurality of thermoelectric elements positioned between the pair of electrically insulating substrates; and
a diffusion barrier formed on each of a top surface and a bottom surface of each of the plurality of thermoelectric elements, wherein the diffusion barrier is formed of a non-magnetic material.

5. The MRI apparatus of claim 1 wherein the cooling system comprises:
a power source configured to generate current for transmission to the plurality of cooling modules; and
a controller programmed to control the amount of current generated by the power source for transmission to the plurality of cooling modules, thereby controlling an amount of heat extracted from the RF coil by the thermoelectric cooler.

6. The MRI apparatus of claim 5 wherein the controller is programmed to:
receive an input on a desired imaging area temperature;
monitor an actual imaging area temperature;
determine an amount of current needed from the power source, for transmission to the plurality of cooling modules, to modify the actual imaging area temperature to the desired imaging area temperature; and
control the power source to generate the needed amount of current.

7. The MRI apparatus of claim 1 wherein the RF coil comprises:
a pair of end rings; and
a plurality of rungs extending between the pair of end rings.

8. The MRI apparatus of claim 7 wherein the cooling system comprises a pair of cooling modules mounted on each of the plurality of rungs, each pair of cooling modules mounted on opposing ends of a respective rung.

9. The MRI apparatus of claim 7 wherein the cooling system comprises:
a vapor chamber mounted on each of the plurality of rungs and running a length thereof, the vapor chamber being in thermal contact with a respective rung; and
a cooling module mounted on each vapor chamber at a central area of each of the rungs between the end rings.

10. The MRI apparatus of claim 7 wherein the cooling system comprises a mounting bracket associated with each of the plurality of cooling modules, and wherein each of the mounting brackets is configured to compression mount a cooling module to a respective rung.

11. The MRI apparatus of claim 10 wherein the mounting bracket comprises:
a fixation portion; and a mounting portion extending out from the fixation portion and comprising a plurality of legs arranged around a perimeter of the mounting portion;
wherein the plurality of legs is configured to mate with the heat sink to exert a pressure thereon to compression mount a respective one of the plurality of cooling modules to a respective rung.

12. The MRI apparatus of claim 11 wherein the mounting portion includes an opening formed therethrough to promote air flow across the heat sink.

13. The MRI apparatus of claim 11 wherein the cooling system further comprises a compression band configured to secure the mounting brackets to an RF former, the compression encircling the RF former to compression mount the fixation portion to the RF former.

14. The MRI apparatus of claim 1 wherein the heat sink is formed from a ceramic or stainless steel.

15. A method for manufacturing a cooling system for reducing operating temperature of an MRI system, wherein the MRI system includes an RF coil, a set of gradient coils and an RF shield, the RF shield formed about an RF space, the RF coil positioned within the RF space and formed about an imaging area, and the gradient coils formed about the RF shield such that the shield de-couples the RF coil from the gradient coils, the method comprising the steps of:
providing a plurality of cooling modules, each of the plurality of cooling modules comprising a thermoelectric cooler and a heat sink affixed to the thermoelectric cooler;
mounting each of the plurality of cooling modules to the RF coil such that the thermoelectric cooler is coupled to the RF coil; and
electrically connecting a power source to the plurality of cooling modules to provide power thereto for reducing the operating temperature of the MRI system.

16. The method of claim 15 wherein mounting each of the plurality of cooling modules to the RF coil comprises:
providing a mounting bracket comprising a fixation portion and a mounting portion having a plurality of legs formed thereon;
securing the fixation portion of the mounting bracket to an RF former;
positioning the compression portion of the mounting bracket adjacently to the heat sink of the cooling module such that the plurality of legs are in contact with the heat sink;
applying a compressive force on the heat sink by way of the plurality of legs such that the cooling module is compression mounted on the RF coil.

17. The method of claim 16 wherein securing the fixation portion of the mounting bracket to the RF former comprises:
providing a compression band configured to encircle the RF former; and
tightening the compression band to compression mount the fixation portion of the mounting bracket to the RF former.

18. The method of claim 15 further comprising providing a controller operatively connected to the power source, the controller configured to control an amount of current generated by the power source.

19. A cooling system for reducing MRI system operating temperature, where the MRI system includes an RF coil, a set of gradient coils and an RF shield, the RF shield formed about an RF space, the RF coil positioned within the RF space and formed about an imaging area, and the gradient coils formed about the RF shield such that the RF shield de-couples the RF coil from the gradient coils, the cooling system comprising:

a plurality of cooling modules positioned within the RF space and configured to extract heat from the RF coil, each of the plurality of cooling modules comprising:
  a thermoelectric cooler positioned adjacently to a rung of the RF coil; and
  a heat spreader mounted on a side of the thermoelectric cooler opposite from the RF coil;
    wherein the thermoelectric cooler is configured to extract heat from the RF coil when a current is applied to the thermoelectric cooler and transfer the heat to the heat spreader.

20. The cooling system of claim 19 further comprising:
a power source configured to generate current for transmission to the plurality of cooling modules; and
a controller programmed to control the amount of current generated by the power source, thereby controlling an amount of heat extracted from the RF coil by the thermoelectric cooler.

21. The cooling system of claim 20 wherein the controller is programmed to:
receive an input on a desired imaging area temperature;
monitor an actual imaging area temperature;
determine an amount of current needed from the power source, for transmission to the cooling modules, to modify the actual imaging area temperature to the desired imaging area temperature; and
control the power source to generate the needed amount of current.

22. The cooling system of claim 19 further comprising a plurality of mounting brackets configured to compression mount the plurality of cooling modules to the RF coil.

23. The cooling system of claim 22 wherein each of the plurality of mounting brackets comprises:
a fixation portion;
a mounting portion extending out from the fixation portion and comprising a central region and an outer region, wherein the outer region includes a plurality of legs extending transversely from the mounting portion;
wherein the plurality of legs are configured to mate with the heat spreader to exert a pressure thereon to compression mount a cooling module of the plurality of cooling modules to the RF coil.

24. The cooling system of claim 23 wherein the central region of the mounting portion includes an opening formed therethrough to promote air flow across the heat spreader.

25. The cooling system of claim 19 wherein the thermoelectric cooler comprises:
a pair of electrically insulating substrates;
a plurality of thermoelectric elements positioned between the pair of electrically insulating substrates; and
a diffusion barrier formed on each of a top surface and a bottom surface of each of the plurality of thermoelectric elements, wherein the diffusion barrier is formed of a non-magnetic material.

* * * * *